United States Patent

George et al.

(10) Patent No.: US 9,012,262 B2
(45) Date of Patent: Apr. 21, 2015

(54) METHOD OF DIRECT TILING OF AN IMAGE SENSOR ARRAY

(75) Inventors: Farrier Michael George, Boyne City, MI (US); Roumbanis John Bernard, Fremont, CA (US)

(73) Assignee: Teledyne Rad-icon Imaging Corp., Thousand Oaks, CA (US)

(*) Notice: Subject to any disclaimer, the term of this patent is extended or adjusted under 35 U.S.C. 154(b) by 0 days.

(21) Appl. No.: 14/004,660

(22) PCT Filed: Apr. 17, 2012

(86) PCT No.: PCT/US2012/000203
§ 371 (c)(1),
(2), (4) Date: Sep. 11, 2013

(87) PCT Pub. No.: WO2012/145038
PCT Pub. Date: Oct. 26, 2012

(65) Prior Publication Data
US 2014/0035084 A1    Feb. 6, 2014

Related U.S. Application Data

(60) Provisional application No. 61/517,414, filed on Apr. 19, 2011.

(51) Int. Cl.
| H01L 21/00   | (2006.01) |
| H01L 23/495  | (2006.01) |
| H01L 31/0232 | (2014.01) |
| H01L 31/18   | (2006.01) |
| H01L 23/00   | (2006.01) |

(52) U.S. Cl.
CPC ........... *H01L 31/0232* (2013.01); *H01L 24/75* (2013.01); *H01L 24/83* (2013.01); *H01L 24/95* (2013.01); *H01L 2224/2919* (2013.01); *H01L 2224/45144* (2013.01); *H01L 2224/45565* (2013.01); *H01L 2224/4569* (2013.01); *H01L 2224/4823* (2013.01); *H01L 2224/49176* (2013.01); *H01L 2224/75744* (2013.01); *H01L 2224/32225* (2013.01); *H01L 2924/00013* (2013.01); *H01L 2924/01013* (2013.01); *H01L 2924/01014* (2013.01); *H01L 2924/10253* (2013.01); *H01L 31/186* (2013.01); *H01L 2224/83* (2013.01)

(58) Field of Classification Search
CPC .................................................. H01L 31/0232
USPC .......... 438/106–112, 123–128; 257/666–676, 257/E23.031, E23.194
See application file for complete search history.

(56) References Cited

U.S. PATENT DOCUMENTS

| 4,849,901 A | * | 7/1989 | Shimizu ................... 700/121 |
| 5,545,899 A | * | 8/1996 | Tran et al. .............. 250/370.09 |
| 6,455,348 B1 | * | 9/2002 | Yamaguchi ................... 438/106 |

* cited by examiner

*Primary Examiner* — Calvin Lee
(74) *Attorney, Agent, or Firm* — Eric A. Gifford

(57) ABSTRACT

A method of making a tiled array of semiconductor dies includes aligning and flattening. One end of each semiconductor die has attached thereto a respective printed circuit board. The aligning aligns the semiconductor dies into the tiled array in such a way that the semiconductor dies rest on a vacuum plate and the one end of each die extends beyond an edge of the vacuum plate. The flattening flattens the semiconductor dies against the vacuum plate with a vacuum after the semiconductor dies are aligned.

15 Claims, 4 Drawing Sheets

METHOD OF DIRECT TILING OF AN IMAGE SENSOR ARRAY

The priority of the Apr. 19, 2011 filing date of provisional application No. 61/517,414 is hereby claimed.

BACKGROUND OF THE INVENTION

Description of Related Art

Large tiled arrays of CMOS image sensors that require either a fiber optic faceplate attachment or a high degree of planarity for X-ray panel applications cannot be manufactured in a cost competitive manner using the existing assembly methodology. Sensor failure rates are high, assembly times are very long, yield is low, and assembly cost per panel is not competitive with other technologies. U.S. Pat. No. 5,545,899 by Tran, et. al., U.S. Pat. No. 7,009,646 by Fossum et. al., and U.S. Pat. No. 7,117,588 by Vafi, et. al. describe tiled or buttable detector arrays but do not describe methodologies for manufacturing of large tiled panels.

Known processes suitable for assembling very large tiled sensor panel assemblies with a FOP attached in a manufacturing setting are scarce. Large arrays of sensors have been assembled on a custom basis and a FOP applied, but such custom process is not suitable for large quantity manufacturing.

In the custom assembly concept, individual sensor die attached to printed circuit board substrates (pcb substrates) are micro-manipulated against a flat glass planar surface. Once aligned, the sensor tiles are locked in place in a holding frame and the flat glass reference plane is removed. In the case where a FOP is attached, the FOP is placed on the locked array and epoxy applied by wicking methodology from the edges of the FOP and array assembly. As this methodology is a non-production assembly process, the many costs associated with labor hours, equipment development, yield, etc. are not considered optimized for cost effective manufacture.

Known large panel tiled array assembly technology consists of assembling image sensor die on ceramic printed circuit board plates that cover the entire back surface of the die. See FIG. 1. The sensor die 10 is attached to ceramic tile printed circuit board 20 using compliant epoxy 28. Sensor die 10 is not planarized during the die attach process, allowing for the natural convex bow of the silicon sensor die to be preserved in the profile of the tile assembly. Additionally, the ceramic substrate printed circuit board contains non-flatness prescribed by the best practices of the ceramic printed circuit board manufacturing process. The combination of the ceramic un-flatness, the epoxy thickness variation, and the sensor die un-flatness create a stacked structure with unpredictable flatness profile generally of thickness 12. Mounted on ceramic printed circuit board substrate 20 is connector 24. Ceramic printed circuit board substrate 20 has printed wiring thereon, and wire bonding 26 connects sensor 10 to the printed wiring on substrate 20 and from there to connector 24. The sensor tile is then able to be easily connected to and removed from other equipment such as a camera. An array of thus constructed sensor tiles are assembled on a vacuum plate using only spacers to attempt to planarize all the sensor tiles to a single uniform flatness at the front surface of the sensor array. In this way, all sensor tiles have varying degrees of bow and mismatch in vertical position. The subsequent FOP attachment procedure is often unable to overcome the lack of planarity of the ensemble of sensors, resulting in sensor failure, bubble formation, and very long process times.

It would be desirable to planarize the sensors to remove modulation transfer function non-uniformity (MTF non-uniformity) at tile corners.

What is needed is a manufacturing process that can assemble multiple sensor tiles into large tiled sensor panel assemblies with a FOP or with a scintillator for X-ray imaging in a way that can reduce substrate printed circuit board costs, reduce the tiled panel assembly labor, reduce the fiber optic faceplate assembly labor, reduce the required skill level of assembly staff and semi-automate FOP assembly. It would also be desirable to increase assembly yield by making the assembly process more "repairable," remove cost and weight of FOP panel by removing a machined metal panel back plate, and improve reliability by removing construction materials with thermal mismatch.

SUMMARY OF THE INVENTION

In an example of a method of making a tiled array of semiconductor dies, the method includes aligning and flattening. One end of each semiconductor die has attached thereto a respective printed circuit board. The aligning aligns the semiconductor dies into the tiled array in such a way that the semiconductor dies rest on a vacuum plate and the one end of each die extends beyond an edge of the vacuum plate. The flattening flattens the semiconductor dies against the vacuum plate with a vacuum after the semiconductor dies are aligned.

In another example of a method of making a tiled array of image sensor dies, the method includes aligning, flattening, connecting and affixing. Each image sensor die constitutes a part of a corresponding sensor assembly. Each sensor assembly includes the image sensor die attached to a printed circuit board. The aligning aligns a plurality of image sensor dies into the tiled array on a vacuum plate that is subjected to a vacuum, and the flattening flattens all image sensor dies in the tiled array against the vacuum plate with the vacuum. The connecting connects test electronics to all of the printed circuit boards, and the affixing affixes the tiled array of image sensor dies to either a fiber optic plate or the flat vacuum plate.

In an example of a tiled array assembly, the assembly includes a plate and a plurality of sensor assemblies. The plate includes either a fiber optic plate or a vacuum plate. Each sensor assembly includes an image sensor die and a printed circuit board. Each image sensor die includes a surface having an optically active area and a distinct edge area. Each printed circuit board includes a surface having a lap edge area. The lap edge area of each printed circuit board is lapped over and attached to the distinct edge area of the respective image sensor die, and the plurality of sensor assemblies are arranged so that the surface of each image sensor die is coplanar with the surface of all other image sensor dies.

BRIEF DESCRIPTION OF DRAWINGS

The invention will be described in detail in the following description of preferred embodiments with reference to the following figures.

DETAILED DESCRIPTION OF PREFERRED EMBODIMENTS

The primary principle of the new direct silicon tiling assembly process (DST assembly process) is the use of silicon die flattening to coplanarity with a vacuum. The herein described practice has been demonstrated during simple tests to be superior to the current tiled panel assembly procedure that has been practiced in production on smaller arrays. The direct silicon tiling (DST) process minimizes losses in assembly yield and minimizes assembly time by removing the impediments to fiber optic plate (FOP) attachment and direct scintillator attachment (non-FOP) caused by un-flat tiled surfaces.

Figure 2:
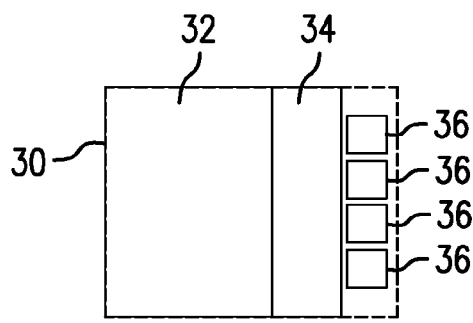
FIG. 2 are plan and section views of and through an image sensor die that is typical of the dies used in the present invention.
Figure 2:
Figure 3:
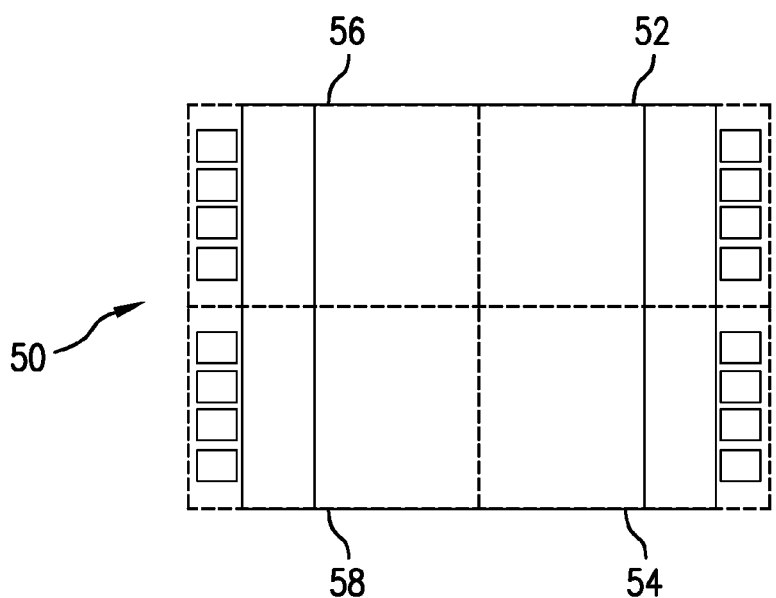
FIG. 3 is a plan view showing a tiled arrangement of four image sensor dies that are typical of the dies used in the present invention.

Multiple large area image sensors are assembled into tiled arrays. In FIG. 2, sensor die 30 includes optically active area 32 and optically inactive area 34 in which multiple bonding pads 36 are formed. Bonding pads 36 are connected to external circuits to provide electrical connections. In FIG. 3, a four sensor tiled array 50 is assembled from four large area image sensor dies 52, 54, 56, 58, although any even number of sensor dies can be assembled into a tiled array. Optically active areas 32 of the sensor dies are butted to one another on three sides. A fourth side of optically active area 32 provides an interconnect edge to optically inactive areas 34 of the sensors.

Figure 4:
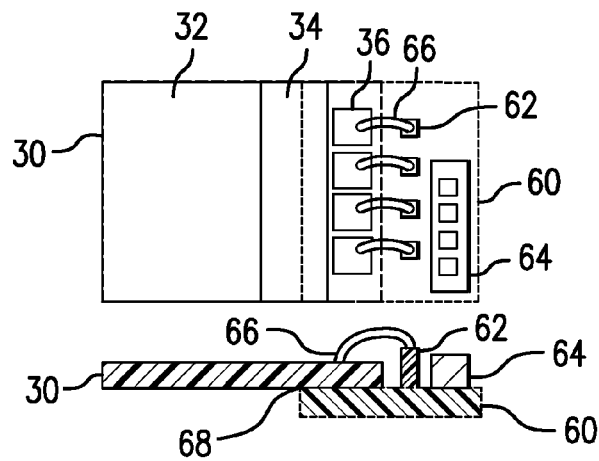
FIG. 4 are plan and section views of and through a sensor assembly that is typical of the sensor assemblies used in the present invention.

In FIG. 4, an example of an improved sensor assembly is formed by affixing sensor die 30 to short section 60 of a printed circuit board (pcb) at one end using adhesive 68, for example, epoxy. The printed circuit board is typically based on a ceramic substrate, but may be of another suitable substrate type. In addition, connector 64 and pins 62 or comparable pads are typically mounted on printed circuit board 60. Electrical connections 66, typically wire bonding connections, are made between bonding pads 36 and pins 62.

Figure 5:
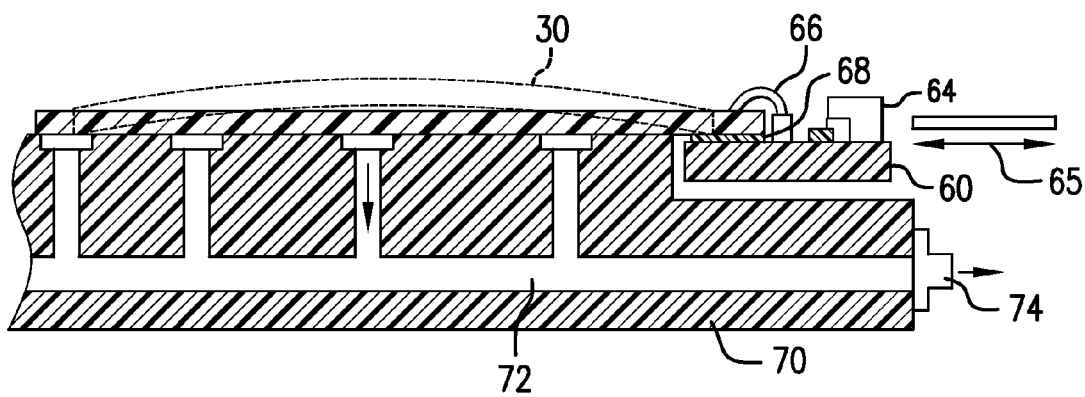
FIG. 5 is a section view through a sensor assembly positioned on a flat vacuum plate with a printed wiring board cantilevered in and over a recess in the vacuum plate.

In FIG. 5, the improved assembly formed of sensor die 30 and short section 60 is placed directly on an ultra-flat vacuum mesa plate 70. Plate 70 has passages 72 formed therein to couple the surface ports in plate 70 to a vacuum at vacuum connector 74. The exposed backside of sensor die 30 is against the surface of plate 70. The printed circuit board 60 is suspended in a peripheral cavity surrounding the vacuum mesa surface. Any camber in sensor die 30 (e.g., the dotted lines in FIG. 5) is removed when a vacuum is applied at 74. Sensor die 30 is drawn flat against ultra-flat vacuum mesa plate 70 as top air pressure presses against the upper side of sensor die 30 and small vacuum ports that extend from the top surface of mesa plate 70 to passages 72 withdraw air from the underside of sensor 30. FIG. 5 also depicts connection cable 65 that provides electrical connection between printed circuit board 60 and another electrical apparatus, typically a camera.

Figure 6:
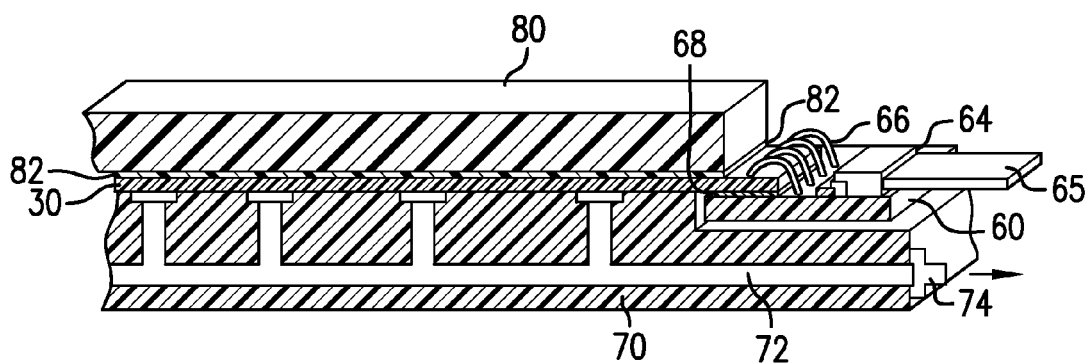
FIG. 6 is a perspective view showing a section through a tiled array focusing on one sensor assembly according to an aspect of the invention.
Figure 7:
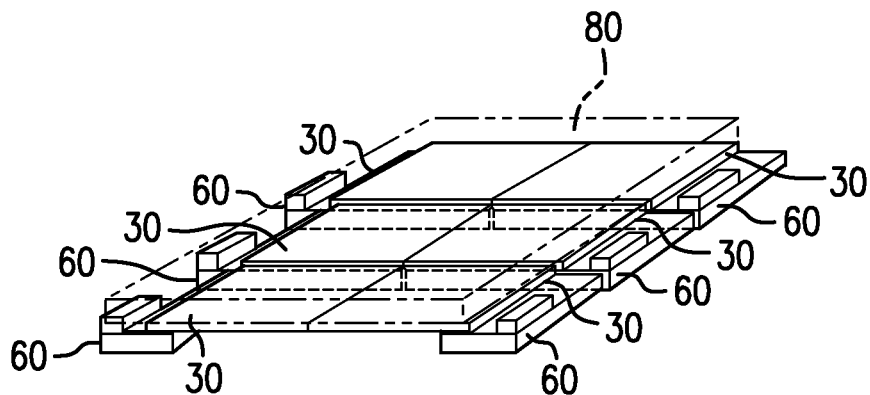
FIG. 7 is a perspective view of a tiled array according to the aspect of the invention depicted in FIG. 6.

For a multiple tiled assembly, the exposed backside of multiple sensor dies 30 are positioned against the ultra-flat surface of plate 70 that is large enough to support the multiple sensor dies. Sensor dies 30 are closely tiled and accurately registered to each other. Vacuum applied through ports at the back of the mesa plate 70 is used to hold the sensor die in alignment and to planarize (e.g., remove camber from) the individual die surfaces. In one embodiment (FIGS. 6 and 7), a fiber optic faceplate 80 (FOP 80) is attached to the tiled array of sensor dies 30 with epoxy 82 while the sensors are held flat by vacuum.

Figure 8:
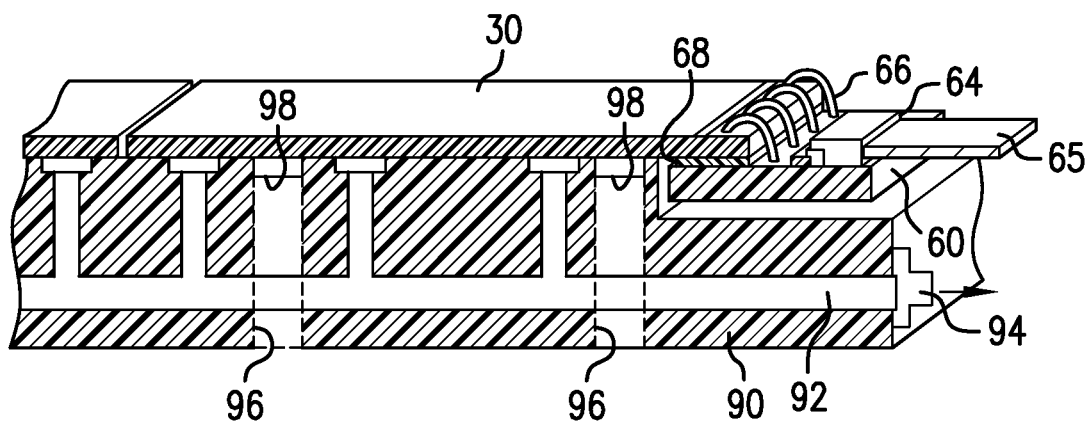
FIG. 8 is a perspective view showing a section through a tiled array focusing on one sensor assembly according to another aspect of the invention.
Figure 9:
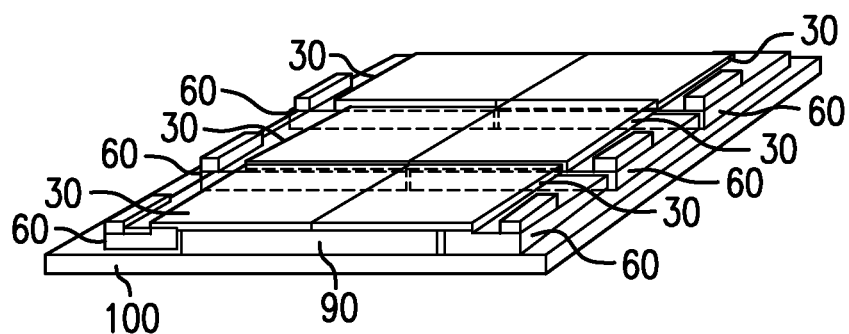
FIG. 9 is a perspective view of a tiled array according to the aspect of the invention depicted in FIG. 8.

In another embodiment (FIGS. 8 and 9), the aligned and flattened array of sensors 30 is permanently attached to vacuum mesa plate 90 with epoxy 98 that may be injected, for example, via ports 96. A fiber optic plate (FOP) may or may not be attached.

The tiled array may be tested during assembly. Sensors that fail during assembly may be easily replaced before epoxy is applied and cured. In the first embodiment, sensor dies 30 are rigidly held in place at the front surface of the sensor dies and attached to FOP 80. The vacuum is released from the backside of sensor dies 30 and the assembly is removed from mesa plate 70. In the second embodiment the backsides of sensor dies 30 are rigidly held in place, drawn to vacuum plate 90, while epoxy 98 is applied. Vacuum plate 90 then becomes part of the rigid detector panel. In both embodiments, the sensor modules are then ready for the next stage of electronics integration.

For example in FIG. 2, a large format rectangular image sensor die 30 is designed with an array area 32 (optically active) and an interface area 34 (optically inactive). The interface area (e.g., optically inactive area 34) is rectangular and disposed against a first edge of the four edges. The array area 32 (optically active) is rectangular and has three sides disposed against remaining three edges of the image sensor.

To make a sensor assembly from large format image sensors assembled into tiled arrays, first manufacture the large format image sensors as dies arranged in an semiconductor wafer, and then cut the dies free.

Figure 10:
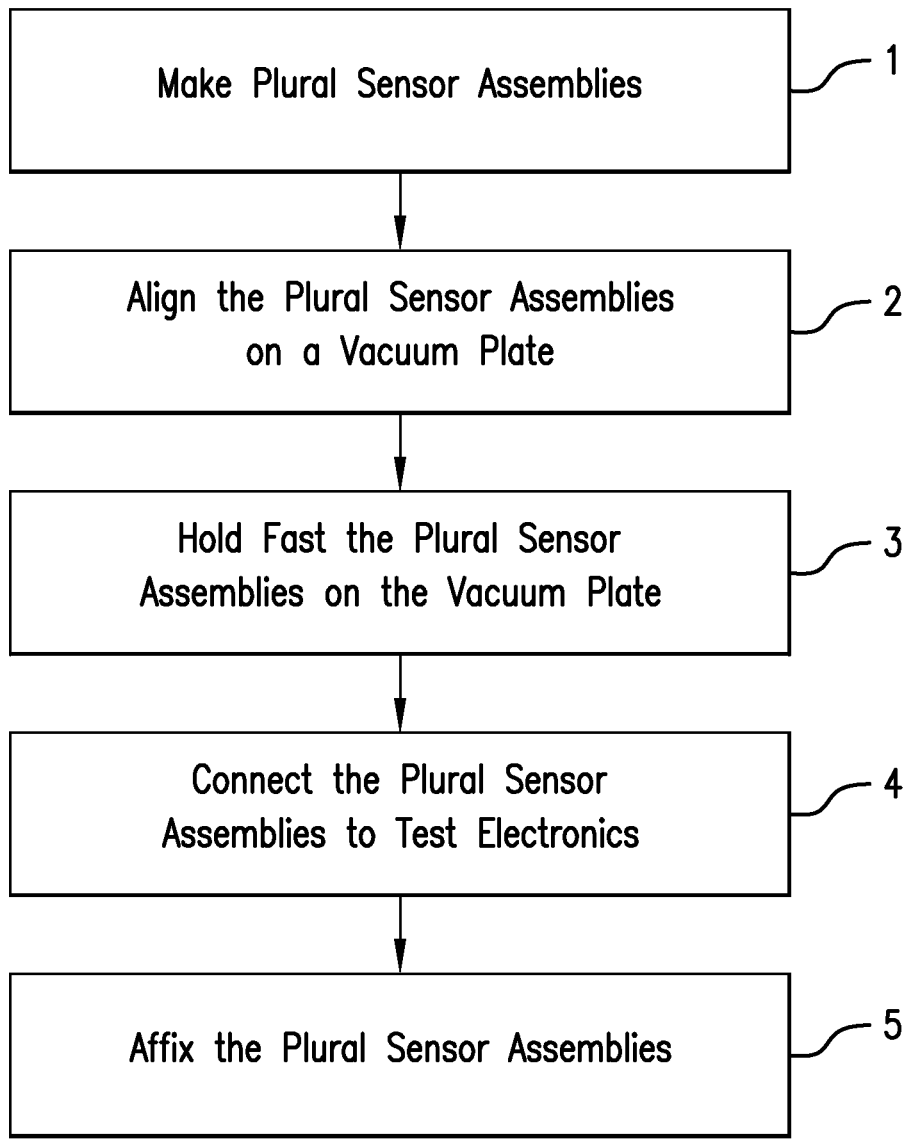
FIG. 10 is a block diagram of an example of a method for direct silicon tiling.

In step 1 of FIG. 10, make plural sensor assemblies. Attach each large format rectangular image sensor die (e.g., 30, FIG. 4, for example a CMOS image sensor die) to a short section printed circuit board (60, FIG. 4) overlapping the silicon die 30 at one end by a small fraction of the die length. The attaching of the image sensor die to the printed circuit board typically includes bonding with adhesive (e.g., epoxy) the image sensor die 30 to short section printed circuit board 60 over a short region of overlap extending along an optically inactive edge 34 of image sensor die 30. In FIG. 4, short section pcb 60 is attached using epoxy 68 to the end of sensor die 30 containing bond pads 36. Then, bond wires 66 depicted in FIG. 4 between bond pads 36 and pins 62 (or equivalent) on pcb 60. Preferably, wire bonds 66 (e.g., gold wires) are potted in epoxy to protect them from damage.

Next, an assembly plate is created. The assembly plate has an ultra-flat assembly area with a mesa structure on its top surface. The assembly area matches the total area of the optically active areas 32 (arrays 32) of the assembled silicon dies tiled in an array. The assembly area has a well (e.g., called a rabbet in carpentry joinery) arranged around the periphery to accommodate a typical ceramic pcb thickness in a free hanging status (see FIG. 6). The assembly plate has one or more vacuum ports (74, FIG. 5) and necessary pathways (72, FIG. 5) leading from port 74 through plate 70 to the ultra-flat mesa surface at the top of vacuum plate 70.

In steps 2 and 3 of FIG. 10, 2×N sensor assemblies (i.e., sensor die 30 with attached pcb 60) are arranged and aligned on the mesa vacuum plate, one assembly at a time, and the semiconductor dies are flattened using vacuum. However, there are multiple ways that steps 2 and 3 can be accomplished.

In most ways of accomplishing steps 2 and 3, a vacuum plate is made with one or more vacuum ports 74 (see FIGS. 5 and 6) all interconnected. The vacuum port or ports 74 have interconnected passages 72.

In one example of step 2 of FIG. 10, a 2×N array of sensor assemblies (sensor die 30 with attached printed circuit board 60) are placed on the mesa vacuum plate and aligned under either light vacuum or even under no vacuum at all where the sensor assemblies are held in place by just gravity. First register an initial tile against a stop, then register successive tiles against the first tile.

After the sensor assemblies are aligned in step 2, in step 3 of FIG. 10, the plural sensor assemblies are held fast against the ultra-flat vacuum plate by sufficient vacuum applied to vacuum port or ports 74 so that the semiconductor dies are flattened against the vacuum plate. As depicted in FIG. 5, sensor dies 30 that have camber (see dotted lines in FIG. 5) are drawn down against the ultra-flat mesa plate with sufficient pressure to planarize (e.g., remove camber) the dies, in situ, and hold them fast in position.

In another example of step 2, the vacuum plate is made with separate vacuum ports 74, one port for each sensor assembly (sensor die 30 with attached pcb 60). Each vacuum port has dedicated passages 72 that couple a specific vacuum port 74 to the specific area on the top side of vacuum plate 70 on which the corresponding sensor assembly is to be flattened. A separate vacuum valve is provided between the vacuum source and each vacuum port 74.

Then in step 2, the first sensor assembly is placed on a first predetermined area on the vacuum plate and then registered against a stop. In step 3, the first sensor assembly is held in place by opening a corresponding vacuum valve to couple the vacuum source to the corresponding area on the top side of vacuum plate 70. However, any other technique can be used to register the first sensor die to the first predetermined area on the vacuum plate. Any camber in sensor die 30 (e.g., the dotted lines in FIG. 5) is flattened when the vacuum valve is opened. Then, steps 2 and 3 are repeated for each successive sensor assembly. In each repeated step 2, a sensor assembly is placed on a corresponding area of vacuum plate 70 and registered in the area, either to another stop or an adjacent sensor assembly. In each repeated step 3, the sensor assembly is held in place by opening the corresponding vacuum valve and thereby flattening the corresponding sensor die 30. After all sensor assemblies are placed on the vacuum plate, properly registered and then held in place against the ultra-flat mesa plate with a vacuum to flatten (e.g., remove camber), the assembly is ready for test step 4.

In step 4 of FIG. 10, the sensor assemblies (sensor die 30 with attached printed circuit board 60) are connected to test electronics via connection cable 65 (FIGS. 5, 6, 8) and light imaging tests are performed to confirm proper functionality of the sensor tiles. Alternatively, the sensor assemblies might be connected to test electronics via connection cable 65 before the sensor assemblies are arranged and aligned on the mesa vacuum plate in steps 2 and 3.

In step 5 of FIG. 10, after all connected sensor assemblies are verified to be functioning correctly by the test electronics, with tiled array of sensor dies 30 held fast and flat by vacuum on mesa vacuum plate and with the printed circuit boards 60 overhanging in the peripheral well around the vacuum plate, the tiled array of sensor assemblies are affixed to either a fiber optic plate from above or the vacuum plate itself from below. In one variant, fiber optic faceplate 80 (FIGS. 6 and 7) is attached to the upper surface of all image sensor dies 30 in the tiled array. In another variant, the reverse side of all image sensor dies 30 are affixed to vacuum plate 90 with adhesive 98 (e.g., epoxy 98) using access ports 96 on vacuum plate 90 (see FIG. 8).

Using the test electronics, the array performance is monitored during FOP or backside attachment. If a sensor failure is noted before the adhesive is cured, the failed sensor assembly (combined die 30 and printed circuit board 60) is removed, replaced and the sensor assemblies are re-aligned before continuing the assembly process.

After the adhesive has cured, the vacuum is released so that the tiled array (as bonded to the fiber optic plate) can be removed. The manufacturing line is continued to next step in panel assembly and test.

In an alternative example, individual sensor dies may be attached and wire bonded to a single contiguous printed circuit board at the time of tiled assembly. The process of alignment of tiles on the vacuum plate could be automated using robotics pick and place equipment and optical feedback control. During FOP assembly, epoxy dispensing and monitoring of image artifacts during assembly could be automated.

Figure 1:
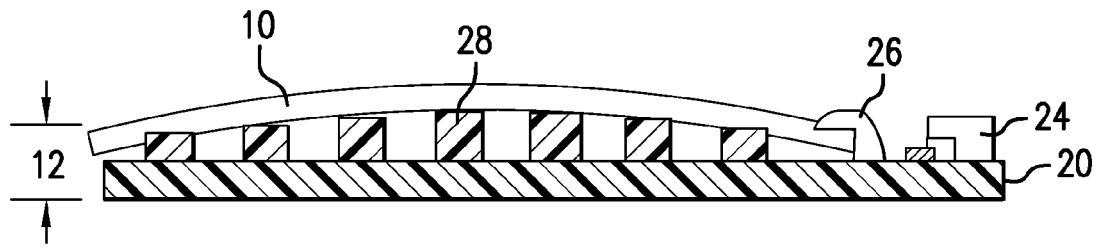
FIG. 1 is a section view through a known sensor tile assembly.

Known methodologies that use wicked epoxy in the large space between a flat FOP surface and an undulating sensor array surface (see FIG. 1), that necessarily has pockets of larger separation from the glass due to the curvature (camber) of the sensor, cannot make the wicked epoxy spread predictably, uniformly and without bubbles in a reasonable manufacturing turnaround time. Furthermore, the micro-manipulation equipment required to perform tile placement and alignment in the known methodologies must be complex and the lock down holding fixture to secure tiles in place requires precision designed and machined moving parts that would be subject to wear and often need re-calibration.

In contrast, an advantage of the herein described process of flattening the sensor surface, compared to known manufacturing methodologies that use sensors affixed to full coverage ceramic tiles (see FIG. 1), include improved panel yield (reduction of failed sensors due to damage caused by the FOP) and throughput. Additionally, the level of skilled operator training can be reduced with the new process. Eventually, automation of the process steps will be more easily achieved because the main component of process instability, sensor un-flatness, is mitigated with the new process. It is estimated that the panel yield can be improved by 25% to 50% and the labor hours per panel can be reduced 50% to 100%.

In the current method disclosed herein, the small printed circuit board once attached to a silicon die, provides a connection point that enables testing of the individual die prior to assembly and provides a point for handling the sensor assemblies.

Older methodologies where the sensor dies are assembled to form a flat array of sensors prior to attachment of the printed circuit board (either individual or multi-die) have disadvantages. For example, silicon sensor dies tend to be fragile and susceptible to handling damage as well as electrostatic discharge damage. This characteristic is all the more apparent when many large sensor dies are assembled to form a flat array of sensors and then the printed circuit board is attached. Positioning sensor dies without the printed circuit board attached for ease of handling exposes the sensor dies to damage and does not allow a method of testing the sensors until the printed circuit board connector is attached. For a large sensor die, there can be yield loss between the step of wafer level testing of the die and the assembled sensor. It is best to discover yield loss of a sensor from dicing and printed circuit board assembly prior to performing an assembly of a large array of sensors.

Furthermore, the cantilevered tile arrangement described herein provides an ability to flatten each sensor die (the tiles of the tiled array) sufficiently to manufacture a viable X-Ray tiled detector. Tiled assembly methods that do not use this cantilevered tile arrangement do not achieve the degree of flatness enabled by the above described method.

Having described preferred embodiments of a novel method of direct silicon tiling (which are intended to be illustrative and not limiting), it is noted that modifications and variations can be made by persons skilled in the art in light of the above teachings. It is therefore to be understood that changes may be made in the particular embodiments of the invention disclosed which are within the scope of the invention as defined by the appended claims.

Having thus described the invention with the details and particularity required by the patent laws, what is claimed and desired protected by Letters Patent is set forth in the appended claims:

1. A method of making a tiled array of semiconductor dies, each said die having an exposed backside, the method comprising:
    aligning the semiconductor dies into the tiled array in such a way that the exposed backsides of the semiconductor dies rest on the surface of a vacuum plate;
    flattening the semiconductor dies against the surface of the vacuum plate with a vacuum after the semiconductor dies are aligned;
    sandwiching the aligned and flattened tiled array of semiconductor dies between the vacuum plate and a fiber optic plate; and
    affixing the aligned and flattened tiled array of semiconductor dies to the fiber optic plate.

2. A method according to claim 1, wherein the aligning aligns the semiconductor dies under a light vacuum and the flattening increases the vacuum to flatten the semiconductor dies against the vacuum plate.

3. A method according to claim 1, wherein each semiconductor die comprises a silicon image sensor die.

4. The method of claim 1, further comprising removing the vacuum plate after affixing the semiconductor dies to the fiber optic plate.

5. The method of claim 1, further comprising affixing the aligned and flattened tiled array of semiconductor dies to the vacuum plate.

6. The method of claim 5, wherein the aligned and flattened tiled array of semiconductor dies are affixed to the vacuum plate prior to sandwiching the semiconductor dies between the vacuum plate and the fiber optic plate and affixing the fiber optic plate.

7. A method according to claim 1, further comprising:
    affixing a section of a printed circuit board (PCB) to the backside at one end of each semiconductor die;
    wherein the semiconductor dies are aligned in such a way that the semiconductor dies rest on a vacuum plate and the one end of each die extends beyond an edge of the vacuum plate with the section of PCB suspended beyond the edge of the vacuum plate in a cantilevered fashion; and
    wherein the semiconductor dies are flattened without contacting the sections of PCB to the vacuum plate.

8. A method according to claim 7, wherein:
    each semiconductor die and its respective printed circuit board constitute a corresponding sensor assembly;
    the aligning includes placing a first semiconductor die of the semiconductor dies on a predetermined area of the vacuum plate and repeating the placing for each additional semiconductor die of the tiled array on additional predetermined areas until all of the semiconductor dies lie in the tiled array on the vacuum plate;
    the method further comprises connecting test electronics to each printed circuit board and verifying that each sensor assembly functions correctly; and
    then affixing the tiled array of semiconductor dies to the fiber optic plate.

9. A method according to claim 8, wherein the affixing of the tiled array of image sensor dies further comprises affixing the tiled array of image sensor dies to the vacuum plate.

10. A method of making a tiled array of image sensor dies, each image sensor die constituting a part of a corresponding sensor assembly, each sensor assembly comprising the image sensor die attached to a printed circuit board, the method comprising:
    aligning a plurality of image sensor dies into the tiled array on a vacuum plate that is subjected to a vacuum;
    flattening all image sensor dies in the tiled array against the vacuum plate with the vacuum;
    connecting test electronics to all of the printed circuit boards;
    sandwiching the aligned and flattened tiled array of semiconductor dies between the vacuum plate and a fiber optic plate; and
    affixing the tiled array of image sensor dies to the fiber optic plate.

11. A method according to claim 10, wherein:
    one end of each image sensor die is attached to the respective printed circuit board; and
    the aligning locates each sensor assembly so that each printed circuit board extends beyond an edge of the vacuum plate in a cantilevered fashion; and
    the flattening flattens the semiconductor dies against the vacuum plate without contacting the printed circuit boards to the surface of the vacuum plate.

12. A method according to claim 10, wherein the semiconductor dies are aligned under a light vacuum that is increased to flatten the semiconductor dies against the vacuum plate.

13. A method according to claim 10, wherein the affixing of the tiled array of image sensor dies further comprises affixing the tiled array of image sensor dies to the vacuum plate.

14. A method of making a tiled array of semiconductor dies, each said die having an optically active area and an exposed backside, the method comprising:
    arranging and aligning the semiconductor dies into the tiled array in such a way that the exposed backsides of the semiconductor dies rest on the surface of a vacuum plate under a light vacuum;
    increasing the light vacuum to flatten the semiconductor dies against the surface of the vacuum plate and hold the semiconductor dies fast in position; and
    affixing either the exposed backsides of the aligned and flattened tiled array of semiconductor dies to vacuum plate or the optically active area of the aligned and flattened tiled array of semiconductor dies to a fiber optic plate.

15. A method of making a tiled array of semiconductor dies, each said die having an optically active area and an exposed backside, the method comprising:
- affixing a section of a printed circuit board (PCB) to the exposed backside at one end of each semiconductor die;
- aligning the semiconductor dies into the tiled array in such a way that the exposed backsides of the semiconductor dies rest on the surface of a vacuum plate and the one end of each die extends beyond an edge of the vacuum plate with the section of PCB suspended beyond the edge of the vacuum plate in a cantilevered fashion;
- flattening the semiconductor dies against the surface of the vacuum plate with a vacuum after the semiconductor dies are aligned without contacting the sections of PCB to the vacuum plate; and
- affixing either the exposed backsides of the aligned and flattened tiled array of semiconductor dies to vacuum plate or the optically active area of the aligned and flattened tiled array of semiconductor dies to a fiber optic plate.

* * * * *

UNITED STATES PATENT AND TRADEMARK OFFICE
CERTIFICATE OF CORRECTION

| | | |
|---|---|---|
| PATENT NO. | : 9,012,262 B2 | Page 1 of 1 |
| APPLICATION NO. | : 14/004660 | |
| DATED | : April 21, 2015 | |
| INVENTOR(S) | : Farrier et al. | |

It is certified that error appears in the above-identified patent and that said Letters Patent is hereby corrected as shown below:

On the title page item [12] should read Farrier et al.

On the title page item [75]

Delete "Farrier Michael George", and insert --Michael George Farrier--

Delete "Roumbanis John Bernard", and insert --John Bernard Roumbanis--

Signed and Sealed this
Fifth Day of April, 2016

Michelle K. Lee
*Director of the United States Patent and Trademark Office*